United States Patent
Nakata

(10) Patent No.: US 10,147,811 B2
(45) Date of Patent: Dec. 4, 2018

(54) PROCESS OF FORMING A HIGH ELECTRON MOBILITY TRANSISTOR (HEMT)

(71) Applicant: SUMITOMO ELECTRIC INDUSTRIES, LTD., Osaka (JP)

(72) Inventor: Ken Nakata, Yokohama (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 15/456,226

(22) Filed: Mar. 10, 2017

(65) Prior Publication Data

US 2017/0263743 A1    Sep. 14, 2017

(30) Foreign Application Priority Data

Mar. 11, 2016   (JP) .................. 2016-048292

(51) Int. Cl.
| | |
|---|---|
| H01L 29/00 | (2006.01) |
| H01L 29/778 | (2006.01) |
| H01L 29/10 | (2006.01) |
| H01L 29/08 | (2006.01) |
| H01L 29/423 | (2006.01) |
| H01L 29/20 | (2006.01) |
| H01L 29/205 | (2006.01) |
| H01L 29/24 | (2006.01) |
| H01L 29/66 | (2006.01) |

(Continued)

(52) U.S. Cl.
CPC ...... *H01L 29/7787* (2013.01); *H01L 21/0254* (2013.01); *H01L 21/0262* (2013.01); *H01L 21/02554* (2013.01); *H01L 21/02565* (2013.01); *H01L 21/02631* (2013.01); *H01L 21/3065* (2013.01); *H01L 21/467* (2013.01); *H01L 29/0843* (2013.01); *H01L 29/1029* (2013.01); *H01L 29/2003* (2013.01); *H01L 29/205* (2013.01); *H01L 29/24* (2013.01); *H01L 29/267* (2013.01); *H01L 29/42376* (2013.01); *H01L 29/66969* (2013.01)

(58) Field of Classification Search
CPC ...................................... H01L 29/24
See application file for complete search history.

(56) References Cited

U.S. PATENT DOCUMENTS

| | | | | |
|---|---|---|---|---|
| 8,324,037 B1 * | 12/2012 | Shih | ................. | H01L 29/42316 257/194 |
| 8,772,786 B2 * | 7/2014 | Tabatabaie | ........ | H01L 29/66462 257/76 |

(Continued)

FOREIGN PATENT DOCUMENTS

JP    2006-261642    9/2006

*Primary Examiner* — Caridad Everhart
*Assistant Examiner* — Ankush Singal
(74) *Attorney, Agent, or Firm* — Smith, Gambrell & Russell, LLP.

(57) ABSTRACT

A process of forming a High Electron Mobility Transistor (HEMT) is disclosed. The HEMT includes a substrate, a channel layer, a barrier layer, and heavily doped regions made of metal oxide. The channel layer and the barrier layer provide recesses and a mesa therebetween. The heavily doped regions are formed by partially removing portions of a heavily doped layer on the mesa so as to have slant surfaces facing the gate electrode. The slant surfaces make angle of 135° to 160° relative to the top horizontal level of the mesa.

10 Claims, 8 Drawing Sheets

(51) Int. Cl.
 *H01L 21/02* (2006.01)
 *H01L 21/467* (2006.01)
 *H01L 21/3065* (2006.01)
 *H01L 29/267* (2006.01)

(56) References Cited

U.S. PATENT DOCUMENTS

| | | |
|---|---|---|
| 2006/0180831 A1 | 8/2006 | Nakazawa et al. |
| 2008/0173898 A1* | 7/2008 | Ohmaki ............. H01L 27/0605 257/194 |
| 2012/0056191 A1* | 3/2012 | Endo ................. H01L 21/30612 257/76 |
| 2013/0168739 A1* | 7/2013 | Kiyama ........... H01L 29/66462 257/194 |

* cited by examiner

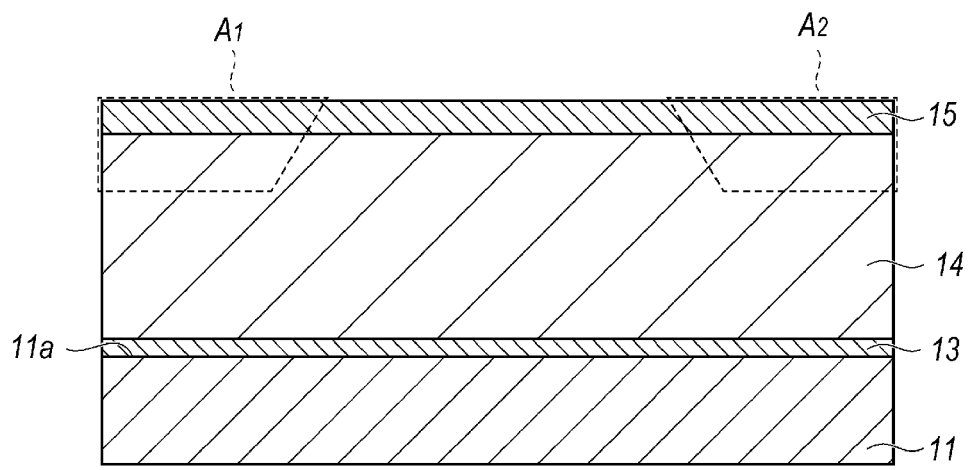
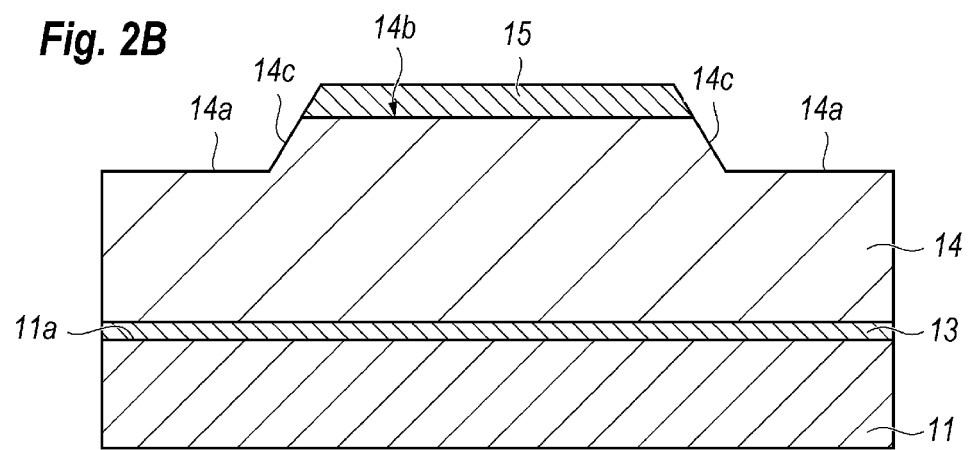

PROCESS OF FORMING A HIGH ELECTRON MOBILITY TRANSISTOR (HEMT)

BACKGROUND OF THE INVENTION

1. Field of the Invention

The present invention relates to a high electron mobility transistor (HEMT), in particular, a HEMT primarily made of nitride semiconductor materials.

2. Background Arts

A conventionally developed HEMT made of nitride semiconductor materials often includes an undoped channel layer made of gallium nitride (GaN), an n-type barrier layer made of aluminum gallium nitride (AlGaN), and an n-type cap layer made of indium aluminum gallium nitride (InAlGaN). Such a conventional HEMT may further provide, on the n-type InAlGaN cap layer, a source electrode and a gate electrode. The n-type InAlGaN cap layer is partially removed to expose a surface of the n-type AlGaN barrier layer, and a gate electrode is provided on the n-type AlGaN barrier layer exposed by the n-type InAlGaN layer.

As well known, nitride semiconductor materials may realize a transistor having an extremely high breakdown voltage because of a wide gap characteristic inherently attributed to those nitride semiconductor materials. Also, a transistor made of nitride semiconductor materials may show good performance in high frequency regions. In order to further enhance the high frequency performance of such a transistor, which is equivalent to increase a cut-off frequency ft of the transistor, the trans-conductance gm of the transistor is necessary to be increased in addition to reduce gate capacitance thereof. Thinner barrier layer may effectively enhance the cut-off frequency ft. A semiconductor material of indium aluminum nitride (InAlN) may be frequently selected as the barrier layer because InAlN may induce an enough electron concentration in the channel layer without increasing a thickness thereof. Reduction of access resistance between the gate electrode and the source electrode of the transistor may also increase the trans-conductance gm of the transistor. The access resistance is a sum of the resistance of the channel between the electrodes and the contact resistance to the electrodes. The reduction of the contact resistance to the source electrode may effectively increase the trans-conductance gm of the transistor. However, when a transistor provides a contact layer on the barrier layer, where the contact layer is generally heavily doped to reduce the contact resistance; inherent access resistance from the electrode to the channel increases because the heavily doped layer and the barrier layer form a barrier in the energy bandgap diagram, namely the band discontinuity, in the interface therebetween.

SUMMARY OF INVENTION

An aspect of the preset application relates to a High Electron Mobility Transistor (HEMT) that comprises a substrate, a channel layer, a barrier layer, and heavily doped regions. The channel layer is provided on the substrate. The barrier layer is provided on the channel layer and has bandgap energy greater than that of the channel layer. The barrier layer and the channel layer form a mesa having a top surface and sides. The heavily doped regions, which are provided on the channel layer and made of metal oxide, sandwiches the mesa therebetween and in contact to the sides of the mesa. The top surface of the mesa has a horizontal level thereof that is lower than horizontal levels of the top surfaces of the respective heavily doped regions.

Another aspect of the present application relates to a process of forming the HEMT. The process includes steps of: (a) sequentially growing a channel layer, a barrier layer on a substrate, where the barrier layer has bandgap energy greater than the bandgap energy of the channel layer; (b) forming recesses in the barrier layer and the channel layer as leaving a mesa between the recesses; (c) forming a heavily doped layer on the mesa and within the recesses; (d) forming a mask on the heavily doped layer, where the mask has an opening above the mesa; (d) partially removing the heavily doped layer on the mesa by wet-etching through the opening in the mask so as to leave n+ regions in above the recesses; and (e) forming a gate electrode on the mesa through the opening in the mask.

BRIEF DESCRIPTION OF THE DRAWINGS

The foregoing and other purposes, aspects and advantages will be better understood from the following detailed description of a preferred embodiment of the invention with reference to the drawings, in which:

FIG. 2A shows a process of growing semiconductor layers on a substrate, and FIG. 2B shows a process of forming recesses as leaving a mesa therebetween;

DESCRIPTION OF EMBODIMENT

Next, embodiment of high electron mobility transistor (HEMT) and processes of forming the HEMT according to the present invention will be described as referring to drawings. In the description of the drawings, numerals or symbols same with or similar to each other will refer to elements same with or similar to each other without duplicating explanations.

Figure 1:
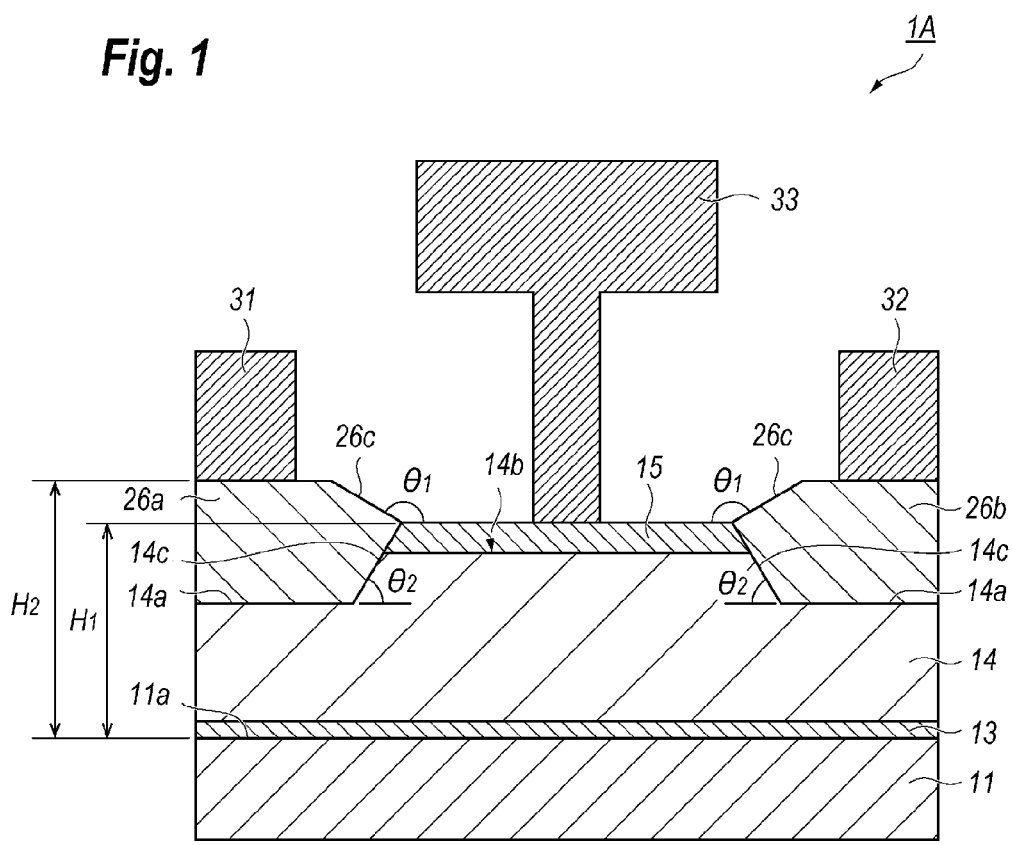
FIG. 1 shows a cross section of a high electron mobility transistor (HEMT) according to embodiment of the present invention.

FIG. 1 shows a cross section of a HEMT 1A according to embodiment of the present invention. The HEMT 1A includes a substrate 11, a buffer layer 13, a channel layer 14, a barrier layer 15, a couple of heavily doped regions (n+ region), 26a and 26b, a source electrode 31, a drain electrode 32, and a gate electrode 33. The HEMT 1A may further provide a passivation layer that covers a whole surface of the semiconductor layers and the electrodes, 31 to 33, which is not illustrated in figures. The electrodes, 31 to 33, may be electrically connected to interconnections provided on the passivation layer through respective via holes formed in the passivation layer.

The substrate 11, which is provided for growing semiconductor layers on a flat surface 11a thereof, may be made of at least one of gallium nitride (GaN), silicon carbide (SiC), silicon (Si), and/or sapphire ($Al_2O_3$). The buffer layer 13 may be made of group III-V nitride semiconductor material containing aluminum (Al), typically, aluminum nitride (AlN), aluminum gallium nitride (AlGaN), and so on. The channel layer 14, which is a layer epitaxially grown on the buffer layer 13 by a thickness of greater than 400 nm but thinner than 1200 nm, may be made of undoped GaN showing an intrinsic characteristic.

The channel layer 14, as shown in FIG. 1, provides a couple of recesses 14a, which may be formed by dry-etching as leaving a mesa 14b therebetween. The recesses 14a provide flat bottoms each having a surface orientation substantially equal to the surface orientation of the primary surface 11a of the substrate 11. The mesa 14b has sides 14c that make an angle against the primary surface 11a of the substrate 11, which is typically greater than 20° but smaller than 45°. That is, an angle $\theta_2$ formed by the side 14c and a virtual plane extending in parallel to the bottom of the recesses 14a is 45° to 70°, which is inherently determined by the surface orientations of the GaN single crystal, and the present embodiment has the angle of 45° or 60°. In other words, the bottom of the recesses 14a makes an angle of 110° to 135° against the sides 14c of the mesa 14b.

The barrier layer 15, which is epitaxially grown on the channel layer 14, is provided only on the mesa 14b, that is, the barrier layer 15 also forms the mesa 14b. The barrier layer 15 may be made of nitride semiconductor material having energy bandgap greater than that of the channel layer 14. For instance, the barrier layer 15 may be made of i-type AlGaN and/or i-type InAlN. The barrier layer 15 may have a thickness of, for instance, greater than 5 nm but smaller than 20 nm, where the present embodiment provides the barrier layer 15 with a thickness of 8 nm. The barrier layer 15 and the channel layer 14 induce the two dimensional electron gas (2DEG) in the interface therebetween, exactly, in the channel layer 14 next to the interface against the barrier layer 15, where the 2DEG becomes a channel of the HEMT 1A. When the barrier layer 15 is made of InAlN, the barrier layer may have indium (In) composition of 15 to 19%, which may be derived from a condition of the lattice miss-matching against the channel layer 14. That is, a larger lattice miss-matching makes the growth of the InAlN barrier layer 15 on the GaN channel layer 14 but the lattice matching causes no or lesser piezo carriers in the 2DEG. The present HEMT 1A provides the barrier layer 15 made of InAlN with the indium composition of 17%.

The n+ regions, 26a and 26b, is formed within the recesses 14a of the channel layer 14. The n+ region 26a is in contact to the side 14c of the mesa 14b, while, the other n+ region 26b is also in contact to the other side 14c of the mesa 14b. Thus, the mesa 14b in the channel layer 14 and the barrier layer 15 are put between the n+ regions, 26a and 26b. The n+ regions, 26a and 26b, of the present embodiment may be made of metal oxide such as n-type zinc oxide (ZnO), or n-type zinc magnesium oxide (ZnMgO), heavily doped with at least one of aluminum (Al) and gallium (Ga). The n+ regions, 26 and 26b, may have a carrier (electron) concentration greater than, for instance, $1 \times 10^{19}$ $cm^{-3}$ and a thickness greater than a total thickness of the mesa 14b including the barrier layer 15; specifically, the n+ regions, 26a and 26b, may have a thickness of 50 to 200 nm, where the HEMT 1A of the present embodiment has the n+ regions, 26a and 26b, with the thickness of 120 nm. Thus, the barrier layer 15 in a top surface thereof shows a horizontal level $H_1$ measured from the primary surface 11a of the substrate is lower than a horizontal level $H_2$ of the top surface of the n+ regions, 26a and 26b, measured from the primary surface 11a of the substrate 11.

The barrier layer 15, as explained later in this specification, exposes the top surface thereof by wet-etching the n+ layer 26. The wet-etching for the n+ layer 26 leaves slant surfaces 26c in the left regions, 26a and 26b, so as to continue to the top surface of the barrier layer 15 as making an angle $\theta_1$ of 135° to 160° against the top surface of the barrier layer 15. That is, the angle between a virtual surface continuous to the top surface of the barrier layer 15 and the slant surface 26c becomes 20° to 45°.

The source electrode 31 and the drain electrode 32 put the gate electrode 33 therebetween. The source electrode 31 is provided on the n+ region 26a, while, the drain electrode 32 is provided on the other n+ region 26b. The gate electrode 33, which is provided on the barrier layer 15, forms a Schottky contact to the barrier layer 15. The gate electrode 33 has a T-shaped cross section with a widened top portion in order to reduce gate resistance thereof.

Next, a process to form the HEMT 1A shown in FIG. 1 will be described as referring to figures. First, as FIG. 2A shows, the process sequentially grows the buffer layer 13, the channel layer 14, and the barrier layer 15 on the substrate 11. Specifically, loading the substrate 11 within the apparatus of the metal organic chemical vapor deposition (MOCVD) and supplying tri-methyl-aluminum (TMA) concurrently with ammonia ($NH_3$) into the MOCVD apparatus, the process epitaxially grows the AlN buffer layer 13. The growth of the buffer layer 13 is carried out under a temperature of 1000 to 1200° C., where the process of the embodiment set the growth temperature of 1080° C. Then, changing the source gas from the TMA to tri-methyl-gallium (TMG), the process grows the GaN channel layer 14 on the AlN buffer layer 13 under a temperature of 1000 to 1100° C., specifically, 1080° C. in the present embodiment. Pressure within the MOCVD apparatus is kept at 13.3 kPa during the growth of two layers, 13 and 14.

Then, the barrier layer 15 is epitaxially grown on the GaN channel layer 14 sequentially to the growth of the GaN channel layer 14. Specifically, when the barrier layer 15 is made of InAlN, the process supplies TMI, TMA, and $NH_3$ within the MOCVD apparatus and sets the temperature and the pressure to be 650 to 850° C., 800° C. in the present embodiment and 13.3 kPa, respectively. Thus, an epitaxial substrate on which the AlN buffer layer 13, the GaN channel layer 14, and the InAlN barrier layer are epitaxially grown may be obtained.

Next, transferring the epitaxial wafer from the MOCVD apparatus to an apparatus that performs a reactive ion etching (RIE) and supplying a reactive gas containing chlorine (Cl) within the reaction chamber of the RIE apparatus, the process removes two regions, $A_1$ and $A_2$, indicated in FIG. 2A into which the n+ regions are to be formed. When the channel layer 14 is made of undoped GaN and the barrier layer 15 is made of undoped InAlN, at least one of chlorine ($Cl_2$) and boron chloride ($BCl_3$) is used as the reactive gas of the RIE process. The RIE process thus forms the recesses 14a as leaving the mesa 14b therebetween as shown in FIG. 2B. The slant surfaces 14c of the mesa 14b may be formed by adjusting the etching conditions, for instance, a mixing ratio of chlorine ($Cl_2$) to a carrier gas, typically nitrogen, and/or the pressure during the etching. For instance, conditions of the etching of the present embodiment are: a flow rate of $Cl_2$ is 5 sccm, that of $BCl_3$ is 30 sccm, a pressure of 0.4 Pa, a plasma frequency of 13.56 MHz, an RF power of 150 W. The RIE process may form the slant sides 14c with an angle of 45° against the normal of the primary surface 11a of the substrate 11 may be obtained. The recesses 14a thus formed may have a depth of 80 nm measured from the top surface of the barrier layer 15.

Next, the epitaxial wafer thus dry-etched is took out from the reaction chamber of the RIE apparatus and cleaned in a surface thereof. Specifically, the RIE process often leaves residuals on a surface of the barrier layer 15 and within the recesses 14a exposed by the RIE process. Wet process using fluoric acid (HF) and/or chloric acid (HCl) may remove such residuals from the surface of the barrier layer 15 and the recesses 14a.

Figure 3A:
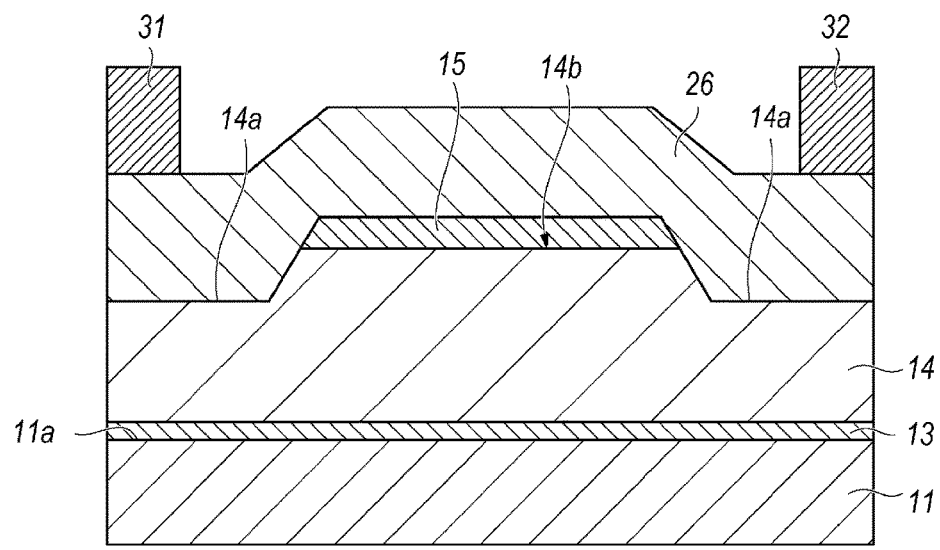
FIG. 3A shows process of forming an n+ layer on a whole surface of an epitaxial substrate shown in FIG. 2B and source and drain electrodes above the recesses.

Then, as FIG. 3A illustrates, a molecular beam epitaxy (MBE) may grow the n+ layer 26 on the whole surface of the epitaxial wafer, specifically, on the top of the barrier layer 15 and within the recesses 14a. The MBE technique may dope at least one of aluminum (Al) and gallium (Ga) by a concentration exceeding $1 \times 10^{19}$ $cm^{-3}$. The n+ layer 26 has a thickness of, for instance, 120 nm. When the n+ layer 26 is made of n-type ZnO, the MBE technique epitaxially grows ZnO within oxygen (O) plasma by using solid zinc (Zn) as a source material for zinc (Zn) under a temperature of 600° C. Subsequent to the growth of the n+ layer 26, the process carries out heat treatment of the grown n+ layer 26 at a temperature higher than 600° C. but lower than 800° C. The present embodiment of the process carries out the heat treatment at 800° C. for 30 minutes in an oxygen atmosphere.

Next, the source electrode 31 and the drain electrode 32 are formed on the n+ layer 26 by the photolithography and subsequent lift-off technique, where the source and drain electrodes, 31 and 32, are preferably made of indium (In) and gold (Au) stacked on In. Thermal treatment of thus formed stacked metal at, for instance 350° C., may form non-rectified contact to the n+ layer 26.

Figure 3B:
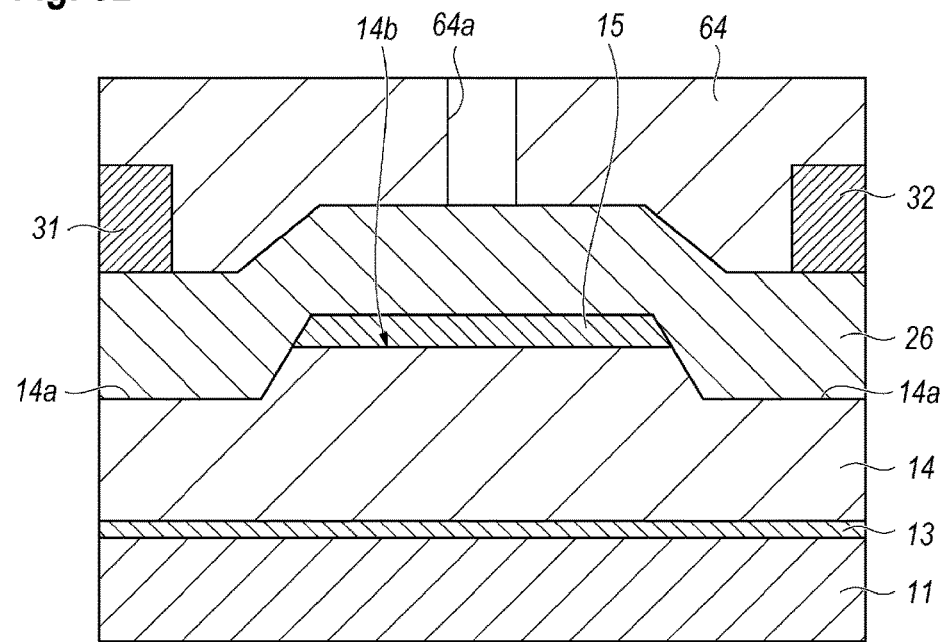
FIG. 3B shows a process of preparing a mask on the n+ layer and the source and drain electrodes, where the mask provides an opening above the mesa.

The process next forms the gate electrode 33. As FIG. 3B indicates, the process prepares a mask 64 made of photoresist so as to cover the source and drain electrodes, 31 and 32, and the n+ layer 26. The mask 64 provides an opening 64a in a position where the gate electrode 33 is to be formed. The opening 64a, which may be formed by, for instance, the electron beam (EB) exposure technique, has a length of 0.1 µm along a direction connecting the source electrode 31 to the drain electrode 32. The photoresist may preferably have a thickness of about 300 nm.

Figure 4A:
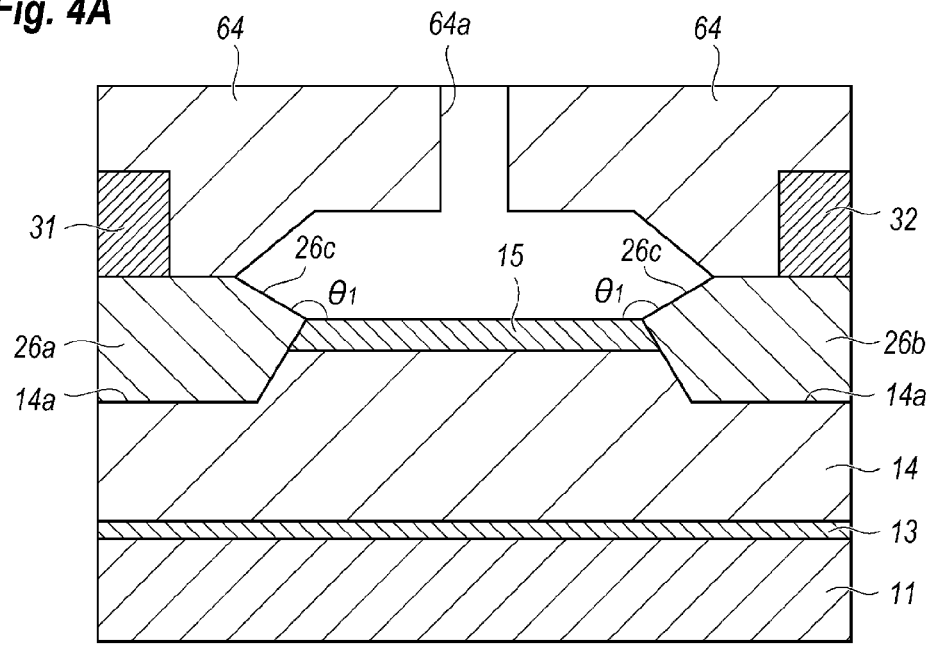
FIG. 4A shows a process of partially etching the n+ layer through the opening in the mask as leaving slant sides.

The n+ layer 26 is partially removed by wet-etching through the opening 64a to form two n+ regions, 26a and 26b, that have slant surfaces 26c as FIG. 4A illustrates. As already described, the slant surfaces 26c have the angle $\theta_1$ against the top of the barrier layer 15 to be 135° to 160°. When the n+ layer is made of ZnO, at least one of a dilute citric acid, a dilute aconitic acid, and an acetic acid may easily form the slant surfaces 26c with such an angle $\theta_1$.

Figure 4B:
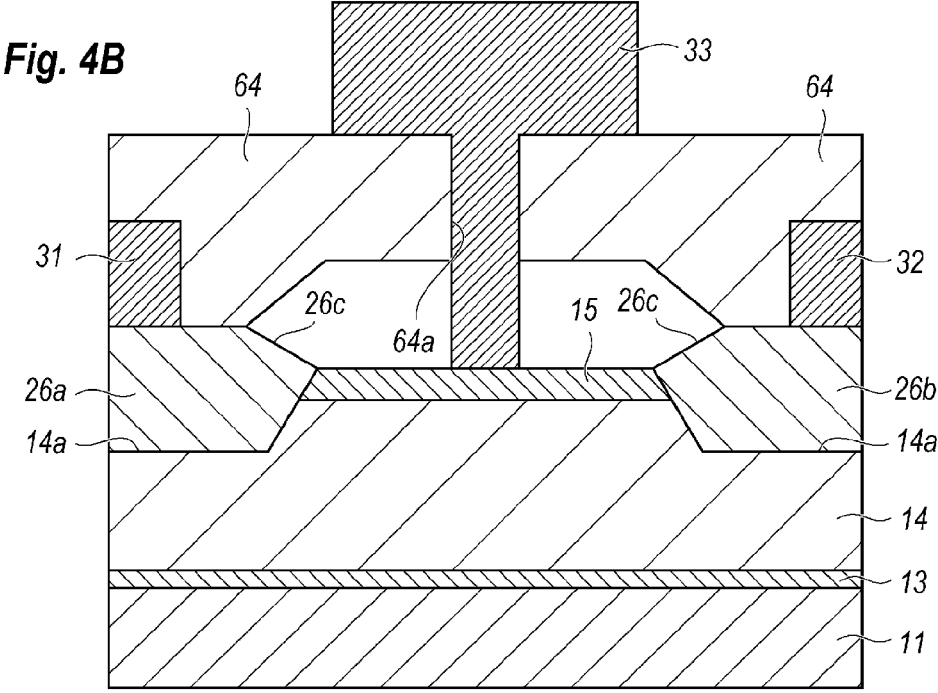
FIG. 4B shows a process of forming a gate electrode so as to be in contact the barrier layer through the opening in the mask.
Figure 5A:
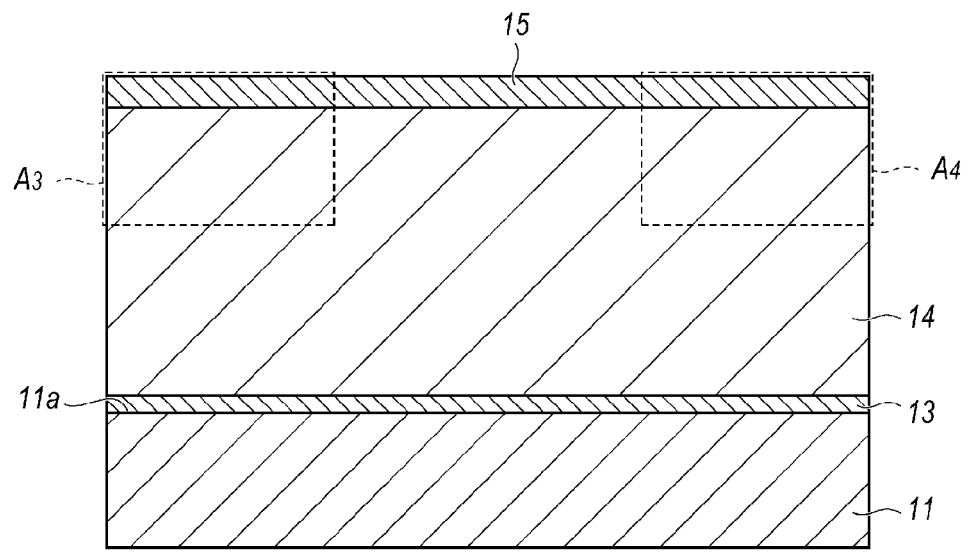
FIG. 5A shows a process of growing semiconductor layers on a substrate for forming a conventional HEMT.
Figure 5B:
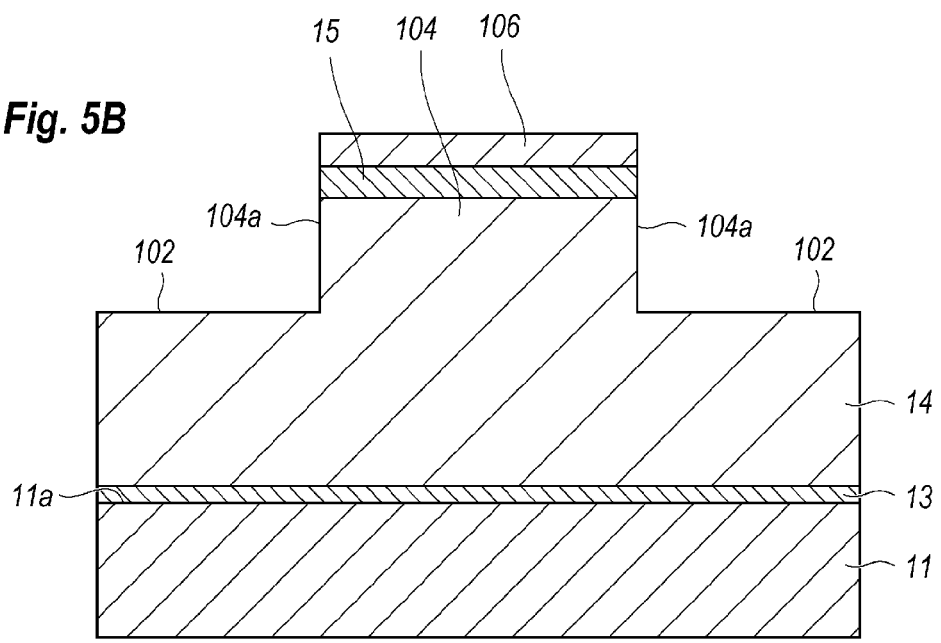
FIG. 5B shows process of forming recesses as leaving a mesa therebetween in the conventional process.

Then, the gate electrode 33 is formed within the opening 64 and partially on the mask 64 as FIG. 4B indicates. The bottom of the gate electrode 33 reaches and is in contact to the top of the barrier layer 15. Also, an upper portion of the gate electrode 33 partially extends on the mask 64. Thus, the gate electrode 33 in a cross section thereof forms a T-character. The gate electrode 33 may be formed by nickel (Ni) stacked with gold (Au). The process finally removes the mask 64 and covers the electrodes, 31 to 33, the exposed surfaces of the barrier layer 15, and the n+ regions, 26a and 26b, with alumina ($Al_2O_3$) formed by, for instance, the atomic layer deposition (ALD) technique. Thus, the process of forming the HEMT 1A according to the present embodiment is completed.

Preferable features of the HEMT 1A and the process of forming the same according to the present embodiment will be described. The HEMT 1A, and the process of forming the same, partially removes the barrier layer 15 and the channel layer 14 to form the recesses 14a in positions corresponding to the source and drain electrodes, 31 and 32; and the n+ regions, 26a and 26b, fill the recesses 14a. The source and drain electrodes, 31 and 32, are provided on the n+ regions, 26a and 26b. This arrangements of the n+ regions, 26a and 26b, and the source and drain electrodes, 31 and 32, may effectively reduce the access resistance from the source and drain electrodes, 31 and 32, to the 2DEG in the channel layer 14.

FIGS. 5A to 7 show processes of forming a HEMT 100 that is comparable to the present HEMT 1A. The process for the HEMT 100 first grows the buffer layer 13, the channel layer 14, and the barrier layer 15 sequentially on the substrate 11, which is substantially same with those of the present process shown in FIG. 2A. Then, a mask 106, which may be made of inorganic material such as silicon nitride (SiN), silicon oxide (SiO), and so on, covers a whole surface of the barrier layer 15; then, the film 106 is patterned so as to leave a region corresponding to the 2DEG, or between the source and drain electrode. Subsequently, the reactive ion etching (RIE) partially removes regions, A3 and A4, where the source and drain electrodes are to be formed using the film 106 as an etching mask. These regions, A3 and A4, include the barrier layer 15. Thus, two recesses 102 and a mesa 104 sandwiched by the recesses 102 may be formed. Although FIG. 5B illustrates steep sides 104a of the mesa 104, the sides 104a may be slant sides similar to those 14c of the present invention.

Cleaning the surfaces exposed by the RIE process above described, the process prepares another mask 107 on the mesa 104, where the mask 107 may be made of silicon oxide ($SiO_2$). The process forms the mask 107 on the whole primary surface 11a of the substrate 11, namely, on the mesa 104 and within the recesses 102, and then removes portions within the recesses 102 by for instance, dry-etching using a reactive gas containing fluoride (F), typically, sulfur fluoride ($SF_6$), carbon fluoride ($CF_4$), and so on. Subsequently, the process grows heavily doped regions 108 made of, for instance, gallium nitride (GaN) on the surfaces 102 of the channel layer 14 exposed within the recesses 102 and on the mask 107 by the MOVPE technique using TMG and ammonia ($NH_3$) as source materials for Ga and N, respectively, and silane ($SiH_4$) as a source material for n-type dopants, respectively. The grown GaN layer 108 has an impurity concentration of around $1 \times 10^{19}$ $cm^{-3}$. The MOVPE growth may be carried out under conditions of; a temperature of 1000° C. and a pressure of 20.0 kPa. Contrary to semiconductor materials such as indium phosphide (InP) generally applied to optical semiconductor devices, semiconductor materials grouped as nitride semiconductors are unable to grow selectively only on a semiconductor material. Such a nitride semiconductor material deposits also on the mask

Figure 6A:
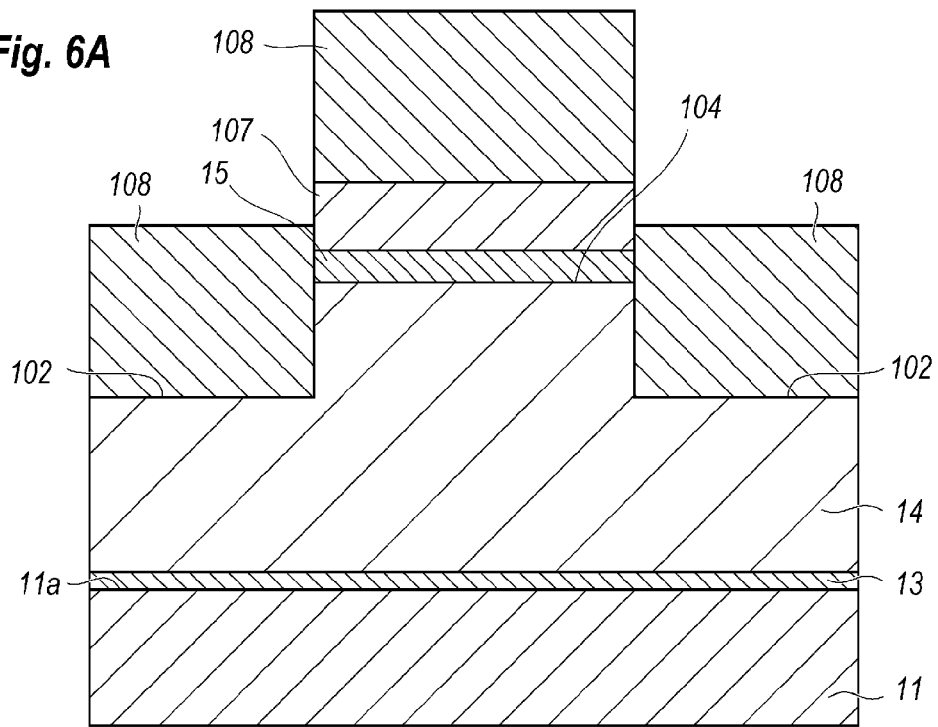
FIG. 6A shows a process of growing an n+ layer within the recesses and depositing a material forming the n+ layer on the mask for forming the mesa.
Figure 6B:
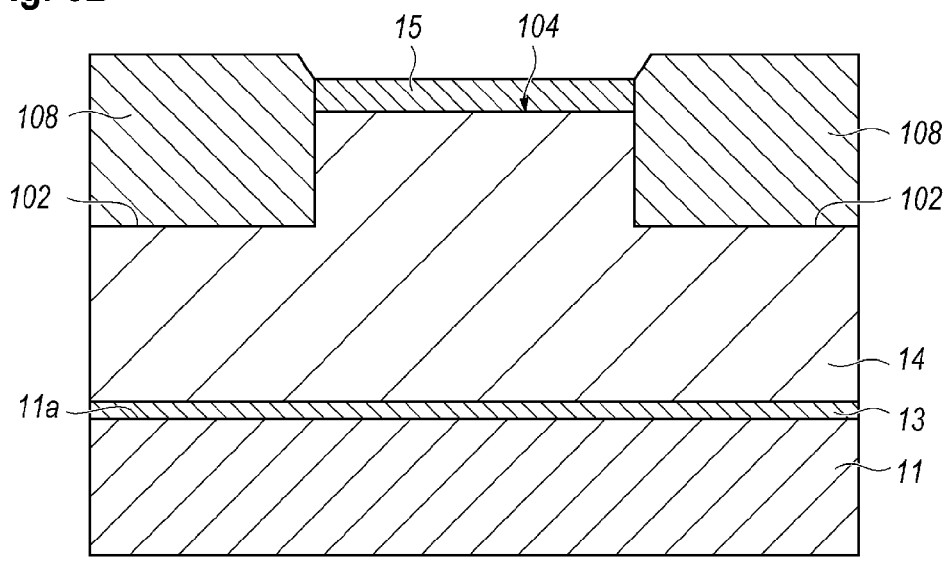
FIG. 6B shows a process of removing the material on the mask concurrently with the removal of the mask.

107 as a form of poly-crystal, non-crystal, amorphous, and so on. Accordingly, the GaN layer 108 deposited on the mask 107 may be removed by immersing the substrate 11 thus processed within a solution containing fluoric acid (HF) to solve the inorganic mask 107 for about 10 minutes to remove the gallium nitride deposited on the mask 107; the process may leave the n+ GaN layers 108 only within the recesses 102, as shown in FIG. 6B.

Figure 7:
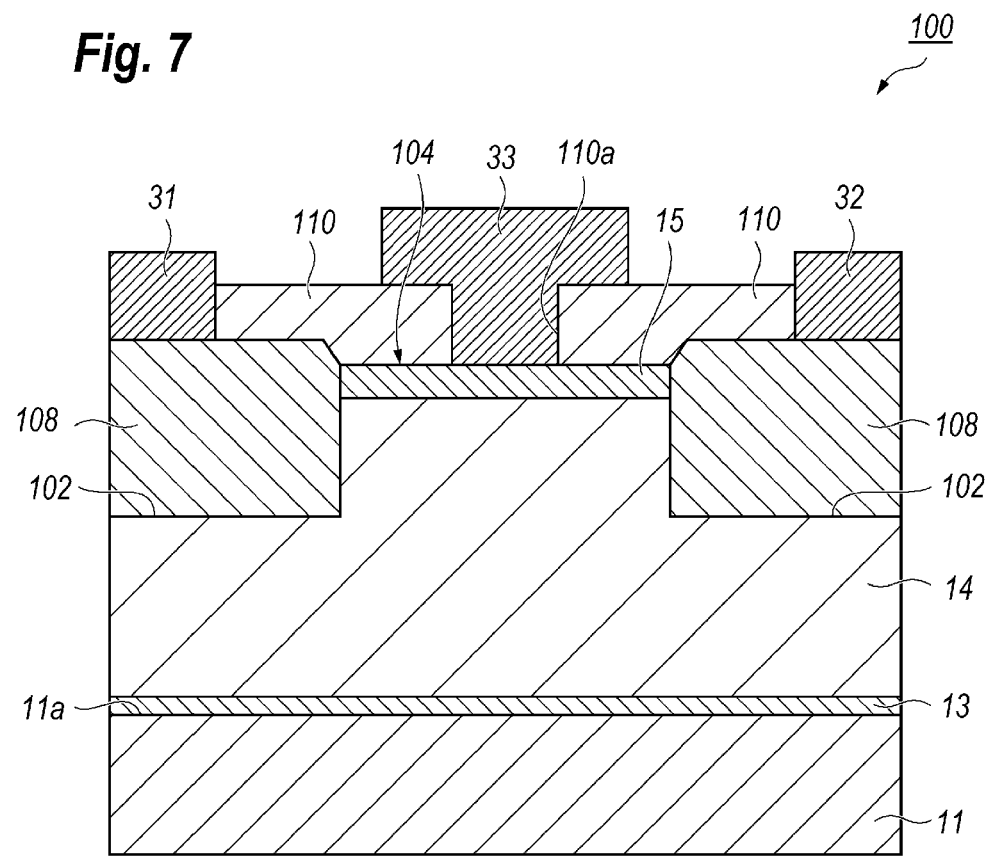
FIG. 7 shows a process of forming the source electrode and the drain electrode on the n+ regions, and the gate electrode on the mesa in the conventional HEMT.

In such a conventional process, the n+ GaN layers in portions close to the mask 107 is grown relatively thicker because a growth rate thereof on the mask 107 becomes slower compared with that in regions apart from the mask 107; because consumption of the source materials, namely, Ga and N, on the mask 107 becomes smaller and residual source materials are carried away to regions neighbor to the mask 107. Thus, the GaN layers 108 close to the mesa 104 is grown in thick. This phenomenon makes a distance between the gate electrode 33 and the edge of the n+ GaN layers 108 short, and causes reduction of voltage endurance and increase of parasitic capacitance between the gate and the drain. After the formation of the n+ GaN layers 108, the conventional process deposits a passivation film 110, typically made of silicon nitride (SiN) on the whole surface of the n+ GaN layers 108 and the barrier layer 15. Then, the source electrode 31 and the drain electrode 32 are formed through openings in the SiN layer 110, and the gate electrode 33 is formed on the top 104 through an opening 110a in the SiN layer 110. Thus, a conventional HEMT 100 is completed as shown in FIG. 7.

A conventional HEMT formed by thus described process was evaluated in performances thereof, where the conventional HEMT under evaluation has dimensions of: a gate length Lg of 0.1 μm, a distance between the source and the drain of 0.8 μm, and a width of the gate in 0.8 μm in a top thereof along the direction connecting the source electrode to the drain electrode. The HEMT showed a cut-off frequency ft of 120 GHz and parasitic capacitance CGs between the gate and the source of 0.6 pF/mm, which is substantially large compared with the gate length thereof, which is because of the a shortened distance between the gate and the n+ GaN layers 108.

On the other hand, the HEMT 1A of the present embodiment whose dimensions around the gate electrode 33, the source electrode 31 and the drain electrode 32 are the substantially same with those of the conventional one described above, showed the performance of: the cut-off frequency ft of 180 GHz that is 50% higher than that of the conventional one, and the parasitic capacitance CGs of 0.4 pF/mm, which is 33% smaller than that of the conventional HEMT. The parasitic capacitance CGs of 0.4 pF/mm is reasonable considering the gate length of 0.1 μm.

Figure 8:
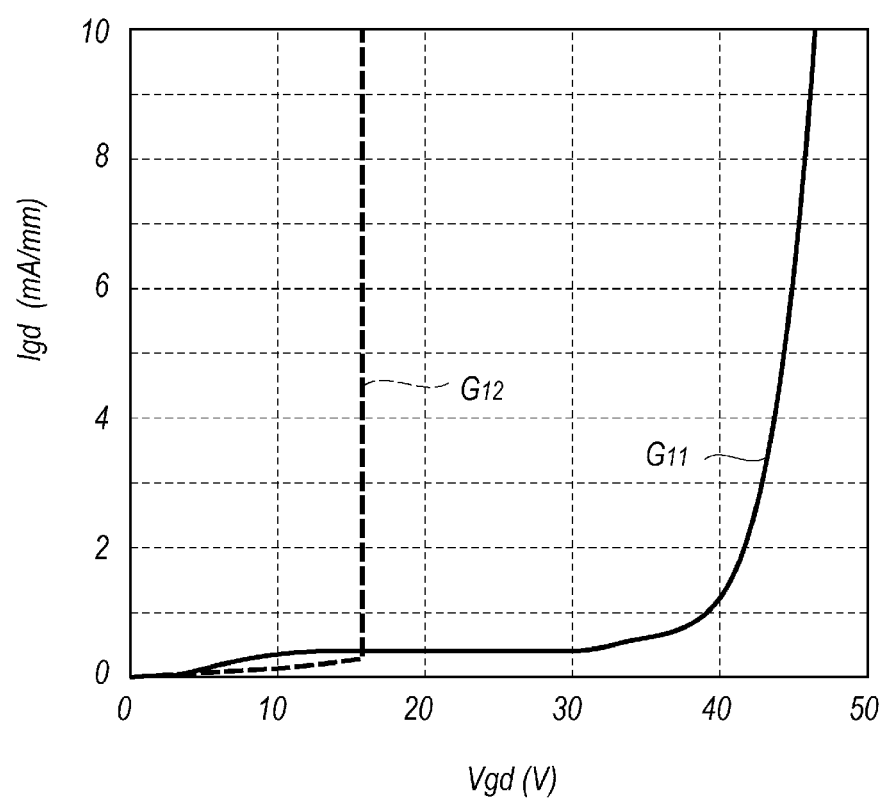
FIG. 8 compares the voltage endurance of the HEMT of the embodiment with the voltage endurance of the conventional HEMT.

FIG. 8 compares the leak current Igd from the gate electrode to the drain electrode in two transistors, where a behavior G11 corresponds to the HEMT 1A of the embodiment and another behavior G12 corresponds to the HEMT 100 comparable to the embodiment. As clearly shown in FIG. 8, the conventional HEMT 100 had the voltage endurance of only 16V and caused the short circuit during the measurement. The HEMT 1A of the embodiment had an excellent voltage endurance exceeding 40 V and caused no short circuit even the leak current Igd exceeds 1 mA/mm.

The HEMT 1A of the embodiment has the n+ regions, 26a and 26b, with the inclined surfaces 26c making a angle $\theta_1$ of 135° to 156° against the top surface of the barrier layer 15, that is, the slant surfaces 26c of the n+ regions, 26a and 26b, facing the gate electrode 33 largely incline, which widens distances between the gate electrode 33 and the n+ regions, 26a and 26b. Resultantly, the voltage endurance between the gate electrode 33 and the source electrode 31, and between the gate electrode 33 and the drain electrode 32, becomes large; while, the parasitic capacitance, Cgs and Cgd, therebetween may be suppressed.

Also, because the n+ regions, 26a and 26, have the inclined sides 26c against the top of the barrier layer 15, the process of etching the n+ layer 26 may have an enough margin, which makes a positional preciseness of the opening 64a for the gate electrode 33 moderate. Moreover, the etching of the n+ layer 26 is carried out using the mask 64 for forming the gate electrode 33, which may make the process for forming the gate electrode 33 simple.

The HEMT 1A of the embodiment provides the n+ regions, 26a and 26b, made of n-type ZnO which may lower the access resistance from the source electrode 31 to the channel layer 14 and the contact resistance thereto compared with an arrangement using the n-type GaN for the n+ regions, 26a and 26b. Lowered access resistance and contact resistance may be effective to enhance the cut-off frequency ft and the trans-conductance gm of the HEMT 1A.

The n+ regions, 26a and 26b, may be made of other materials having large electrical conductivity as far as not forming a large hetero-barrier against the channel layer 14. Also, such materials are preferably etched as forming sides slant with the angle of $\theta_1$ against the top surface of the barrier layer 15 and showing a large etching selectivity against the barrier layer 15. Metal oxide such as indium oxide ($In_2O_3$), tin oxide ($SnO_2$), cadmium oxide (CdO), titanium oxide ($TiO_2$), and materials mixing those metal oxides, for instance, indium tin oxide (ITO) may have resistivity small enough to be applicable to the n+ regions, 26a and 26b. Also, adjusting compositions thereof, namely, mixing ratio, the hetero barrier against the GaN channel layer may be adjustable. Metal oxides are generally solvable for acid; that is, those materials may be partially removed by the wet-etching through the opening 64a prepared in the mask 64 by an etchant.

The HEMT 1A of the embodiment preferably provides the substrate 11 made of one of gallium nitride (GaN), silicon carbide (SiC), silicon (Si), and sapphire ($Al_2O_3$); the channel layer 14 made of i-type GaN, and the barrier layer 15 made of i-type InAlN. Such an arrangement of the semiconductor layers may realize in the HEMT 1A having large voltage endurance. The HEMT 1A may further provide a cap layer of the barrier layer 15, where the cap layer is preferably made of nitride semiconductor material having bandgap energy smaller than that of the barrier layer 15, typically GaN.

The process of forming the HEMT 1A has a step of forming the gate electrode 33 by using the mask that is prepared for partially removing the n+ layer 26. That is, the gate electrode 33 may be formed without removing the mask 64 for partially etching the n+ layer 26, which may simplify the process and reduce the cost thereof.

Because the n+ layer 26 is made of metal oxide, such as ZnO, the n+ layer may be easily removed by the wet-etching using an etchant of, for instance, dilute citric acid, dilute aconitic acid, and/or acetic acid, which may expose the slant surfaces 26c in the n+ regions, 26a and 26b, where the slant surfaces make the angle $\theta_1$ of 135° to 160° against the top surface of the barrier layer 15, or the top of the mesa. When the channel layer 14 and the barrier layer 15 are made of i-type GaN and i-type InAlN, respectively, the process of the embodiment may form the mesa 14b by dry-etching using at least one of chlorine ($Cl_2$) and boron chloride ($BCl_3$).

While particular embodiments of the present invention have been described herein for purposes of illustration, many modifications and changes will become apparent to those skilled in the art. For instance, the process forms the source electrode 31 and the drain electrode 32 on the n+ layer 26 before the formation of the n+ regions, 26a and 26b. However, the source electrode 31 and the drain electrode 32 may be formed after the formation of the gate electrode 33, that is, after the formation of the n+ regions, 26a and 26b. Also, the embodiment forms the gate electrode 33 just after the formation of the n+ regions, 26a and 26b, by the partial etching of the n+ layer 26 without removing the mask 64. However, the gate electrode 33 may be formed after the removal of the mask 64. Accordingly, the appended claims are intended to encompass all such modifications and changes as fall within the true spirit and scope of this invention.

The present application claims the benefit of priority of Japanese Patent Application No. 2016-048292, filed on Mar. 11, 2016, which is incorporated herein by reference.

I claim:

1. A process of forming a high electron mobility transistor (HEMT) comprising steps of:
    sequentially growing a channel layer and a barrier layer on a substrate, where the barrier layer has bandgap energy greater than bandgap energy of the channel layer;
    forming recesses in the barrier layer and the channel layer as leaving a mesa between the recesses;
    forming a heavily doped layer on the mesa and within the recesses;
    forming a mask on the heavily doped layer, the mask having an opening above the mesa;
    partially removing the heavily doped layer on the mesa by wet-etching through the opening in the mask so as to leave heavily doped regions above the recesses; and
    forming a gate electrode on the mesa through the opening in the mask.

2. The process of claim 1,
    wherein the step of forming the heavily doped layer includes a step of growing a metal oxide doped with at least one of aluminum (Al) and gallium (Ga) to a concentration of at least $1.0 \times 10^{19}$ cm$^{-3}$.

3. The process of claim 2,
    wherein the step of forming the heavily doped layer is carried out by a molecular beam expitaxy (MBE) technique within oxygen (O) plasma at a temperature around 600° C.

4. The process of claim 1,
    wherein the step of partially removing the heavily doped layer is carried out using at least one of a dilute citric acid, a dilute aconitic acid, and an acetic acid.

5. The process of claim 1,
    wherein the step of forming the recesses includes a step of etching the barrier layer and the channel layer by dry-etching using at least one of chloride ($Cl_2$) and boron chloride ($BCl_3$) as a reactive gas.

6. The process of claim 5,
    wherein the step of forming the recesses includes a step of forming the mesa with sides thereof making an angle of 110° to 135° relative to a bottom of the recesses.

7. The process of claim 1,
    wherein the step of partially removing the metal oxide includes a step of exposing sides of the metal oxide making an angle of 135° to 160° against a top of the mesa.

8. A process of forming a high electron mobility transistor (HEMT) that provides a substrate made of one of gallium nitride (GaN), silicon carbide (SiC), silicon (Si), and sapphire ($Al_2O_3$), comprising steps of:
    sequentially growing on the substrate a channel layer made of GaN and a barrier layer made of undoped indium aluminum nitride (InAlN) having bandgap energy greater than a bandgap energy of the GaN;
    forming recesses in the barrier layer and the channel layer, the recesses leaving a mesa therebetween;
    growing a zinc oxide (ZnO) layer on the mesa and within the recesses, the ZnO layer being doped with at least one of aluminum (Al) and gallium (Ga) to a concentration of at least $1.0 \times 10^{19}$ cm$^{-3}$;
    forming a mask on the ZnO layer, the mask having an opening above the mesa; and
    partially removing the ZnO layer on the mesa by wet-etching through the opening in the mask.

9. The process of claim 8,
    wherein the step of growing the ZnO layer is carried out by a molecular beam epitaxy (MBE) technique using solid zinc as a source and within an oxide (O) plasma at a temperature around 600° C.

10. The process of claim 9,
    further including a step of heat treatment of the ZnO layer at a temperature higher than 600° C. but lower than 800° C. before the step of forming the mask.

* * * * *